United States Patent [19]
Riseman

[11] 3,893,156
[45] July 1, 1975

[54] NOVEL BEAM LEAD INTEGRATED CIRCUIT STRUCTURE AND METHOD FOR MAKING THE SAME INCLUDING AUTOMATIC REGISTRATION OF BEAM LEADS WITH CORRESPONDING DIELECTRIC SUBSTRATE LEADS

[75] Inventor: Jacob Riseman, Poughkeepsie, N.Y.

[73] Assignee: IBM Corporation, Armonk, N.Y.

[22] Filed: June 29, 1973

[21] Appl. No.: 375,296

[52] U.S. Cl. ...................... 357/67; 357/68; 357/69; 357/70; 357/71

[51] Int. Cl. ............................ H01l 3/00; H01l 5/00

[58] Field of Search ................ 317/234, 1, 4, 5, 5.4, 317/5.3

[56] References Cited

UNITED STATES PATENTS

| | | | |
|---|---|---|---|
| 3,622,385 | 11/1971 | Stork | 317/234 M |
| 3,666,588 | 5/1972 | Wanesky | 317/234 N |
| 3,771,219 | 11/1973 | Tuzi et al. | 317/234 N |

OTHER PUBLICATIONS

IBM Technical Disclosure Bulletin; by Castrucci et al., Vol. 9, No. 12, May 1967, p. 1805.
IBM Technical Disclosure Bulletin; by Hamilton et al., Vol. 14, No. 1, June 1971, pp. 257 & 258.
IBM Technical Disclosure Bulletin; by Ainslie et al., Vol. 14, No. 1, June 1971.

*Primary Examiner*—Andrew J. James
*Attorney, Agent, or Firm*—J. B. Kraft

[57] ABSTRACT

A beam-lead integrated circuit chip structure which comprises a semiconductor chip substrate having a passivated planar surface from which active and passive devices in the circuit extend into the substrate. A plurality of peripheral beam-leads interconnected with the chip devices extend beyond the periphery of the chip and a plurality of solder mounds having a lower melting point than said beam-leads extends from the surface of the chip to a point beyond the plane of the beam-leads.

This chip structure permits a method of automatic alignment of said plurality of beam-leads with a corresponding plurality of beam-leads on a dielectric substrate which involves placing the chip on the substrate so that said plurality of solder mounds are respectively in registration with a plurality of corresponding solder-wettable land pads on said non-wettable dielectric substrate. The structure is then heated to melt the solder mounds, wetting said land pads and thereby moving the chip so as to bring said beam-leads into registration with a plurality of corresponding land leads.

16 Claims, 15 Drawing Figures

NOVEL BEAM LEAD INTEGRATED CIRCUIT STRUCTURE AND METHOD FOR MAKING THE SAME INCLUDING AUTOMATIC REGISTRATION OF BEAM LEADS WITH CORRESPONDING DIELECTRIC SUBSTRATE LEADS

BACKGROUND OF THE INVENTION

The present invention relates to beam-lead chip structures and assemblies, and methods for forming suchstructures and assemblies. The beam-lead structure is probably the most widely used expedient for connecting an integrated circuit chip to a conductive land pattern on a dielectric supporting substrate which provides the pluggable integrated circuit assembly. The standard planar integrated circuit comprises a semiconductor chip substrate having a planar surface from which the active and passive devices extend into the substrate. The surface is passivated with a layer of electrically insulative material, e.g. a glass such as silicon dioxide, and the metallic interconnector pattern which interconnects the devices into the integrated circuit is disposed on this insulative layer, selectively connected to devices by contacts which extend through the layer. The interconnector pattern may be covered by a further layer of insulative material. In the conventional beam-lead structures, a plurality of beam-leads formed on the level of said interconnector pattern and connected to said pattern extend in a cantilevered fashion beyond the chip periphery. These beam-leads are conventionally connected to a plurality of corresponding land leads on the dielectric substrate.

A significant problem in beam-lead technology remains the development of fast, effective and efficient means for bringing the chip beam-leads into registration with the corresponding land leads in order that effective bonding may be accomplished. To date, it is believed that the most effective way of bringing the beam-leads into registration with the corresponding land leads remains manual positioning under a microscope. Unfortunately, with the rapidly decreasing size of integrated circuit chips and the corresponding high rate of densification of circuitry and connectors, the beam-leads and the spacing between them are shrinking to the point that manual positioning willl no longer be possible.

Once the positioning has been completed, the bonding of the beam-leads to the corresponding land leads is accomplished by standard bonding apparatus such as the bonding apparatus described in U.S. Pat. Nos. 3,475,814 and 3,672,034.

In addition, in beam-lead integrated circuit chips as in all integrated circuit chips, with the increasing device densities of large scale integration, there is an ever-increasing need to conserve the maximum semiconductor substrate "real estate" in device fabrication.

In addition, there is a need for a beam-lead integrated circuit chip structure wherein the beam-lead metallurgy does not encroach upon or interfere with the layout of the interconnector metallization.

SUMMARY OF THE PRESENT INVENTION

Accordingly, it is a primary object of the present invention to provide a beam-lead integrated circuit chip structure and method providing automatic alignment between the chip beam-leads and the corresponding conductive land leads on a dielectric substrate to provide a beam-lead assembly.

It ia another object of the present invention to provide a beam-lead integrated circuit chip structure and fabrication method which permits the utilization of maximum integrated circuit device density.

It is a further object of the present invention to provide an integrated circuit beam-lead chip structure and fabrication method which is capable of automated beam-lead to land lead registration for beam-leads which are so small in dimensions as to be beyond manual alignment capabilities.

It is yet another object of the present invention to provide a beam-lead integrated circuit chip structure and method of fabrication wherein the chip beam-leads do not encroach upon the disposition of the integrated circuit metallic interconnector patterns.

It is yet a further object of the present invention to provide a novel method of beam-lead integrated circuit chip fabrication which avoids etching through the back side of the wafer in order to free the beam-leads beyond the periphery of the chip.

It is even another object of the present invention to provide a method of beam-lead integrated circuit chip fabrication wherein the number of beam-lead chips obtainable from a semiconductor wafer is maximized.

It is still a further object of the present invention to provide a beam-lead structure and method of fabrication which is readily adaptable to multi-level metallic interconnection patterns on the chip.

In accordance with the present invention, the beam-lead integrated circuit chip structure, which is automatically self-alignable on the dielectric substrate, comprises a semiconductor chip structure having a passivated planar surface from which the active and passive devices in the circuit extend into the substrate, a plurality of peripheral beam-leads interconnected with the circuit devices extending beyond the periphery of the chip, and a plurality of solder mounds having a lower melting point than said beam-leads extending from said surface to a plane further from said surface than the plane of said beam-leads. The solder mounds are preferably electrically insulated from said chip substrate and from said beam-leads.

Then, in accordance with the method of the present invention for achieving automatic self-alignment or self-registration of beam-lead chip on a dielectric supporting substrate, a dielectric substrate is utilized which comprises a metallic land pattern formed on a surface of said substrate, a plurality of land leads extending from said conductive land pattern on said substrate disposed so as to correspond with said plurality of beam-leads, and a plurality of solder-wettable land pads on said non-wettable dielectric substrate disposed so as to correspond to said plurality of solder mounds.

The self-registration method of the present invention involves the above-described chip on the dielectric substrate so that the plurality of solder mounds are respectively in registration with the plurality of land pads, heating the structure to melt the solder mounds whereby the solder mounds selectively wet the corresponding land pads to bring the plurality of beam-leads respectively into registration with the plurality of corresponding land leads. Then, the structure is cooled to solidify the solder mounds and thereby fix said registration.

In accordance with another aspect of the present invention, a novel beam-lead chip structure is fabricated by a method which comprises forming a first layer of electrically insulative material over a semiconductor chip substrate having a surface from which the active and passive devices in the circuit extend into the substrate. Then, forming a metallic interconnector pattern on said layer in a first plane which is selectively connected to the devices by contacts which extend through said first layer, a second layer of electrically insulative material is formed over said interconnector pattern and a plurality of peripheral chip contacts extending through said second layer into contact with said interconnector pattern are formed. In addition, a metallic layer over said second insulative layer is formed. Then, a plurality of discrete beam-leads of a different metal if formed on said metallic layer; these leads are respectively in contact with said peripheral chip contacts and extend beyond the periphery of the chip. Then, by selective etching with an etchant which attacks the metallic layer, the metallic layer is removed from all regions not covered by the beam-leads, and preferably, the selective etching step is conducted in such a manner so as to etch away by undercutting, portions of the metallic layer under the beam-leads to provide cantilevered beam-leads respectively mounted on said chip contacts and spaced from said second insulative layer.

The integrated circuit beam-lead structure formed by this method has beam-leads on a different level of metallurgy than said metallic interconnector pattern. Consequently, the beam-leads do not encroach upon or in any way interfere with the disposition of said interconnector pattern. Also, since the beam-leads are not on the same level with the metallic interconnector pattern, it may be readily seen that the metallic interconnector pattern may be implemented in multi-level metallurgy with only one layer of said multi-level metallurgy, e.g., the top layer, being in contact with the level containing said beam-leads.

The foregoing and other objects, features and advantages of the invention will be apparent from the following more particular description and preferred embodiments of the invention as illustrated in the accompanying drawings.

DETAILED DESCRIPTION OF THE PREFERRED EMBODIMENTS

Figure 2:
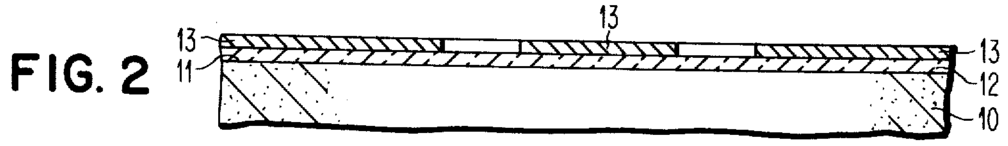
FIGS. 2–2K ar diagrammatic sectional views to illustrate the fabrication of the beam-lead chip of the present invention and placement and self-registration of said beam-lead chip with respect to the dielectric substrate. This sectional view is taken along lines 2—2 of FIG. 1; initially, only the cross-section of the chip is shown, and before the final two steps, the section includes the dielectric substrate and the chip.
Figure 2A:
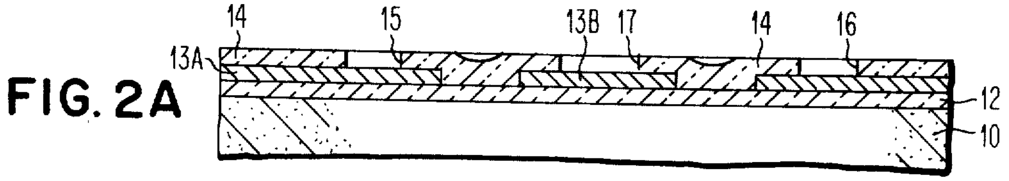
Figure 2B:
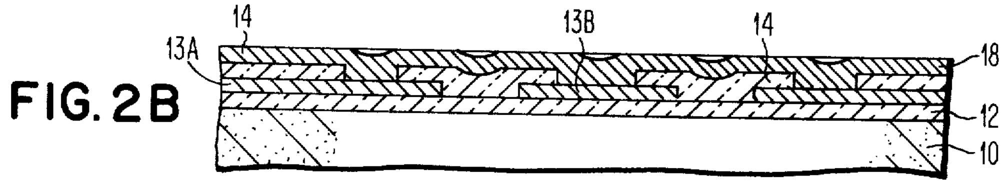
Figure 2C:
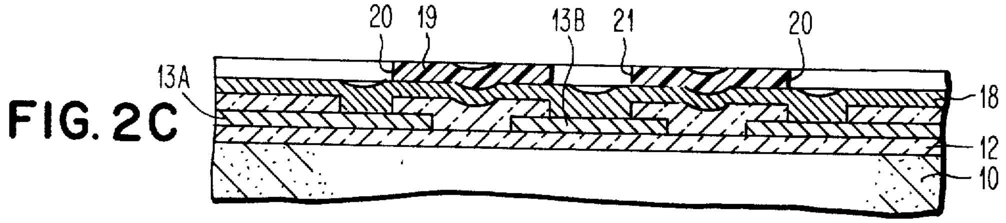
Figure 2D:
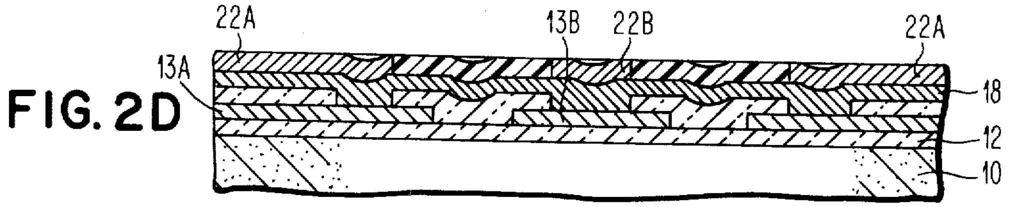
Figure 2E:
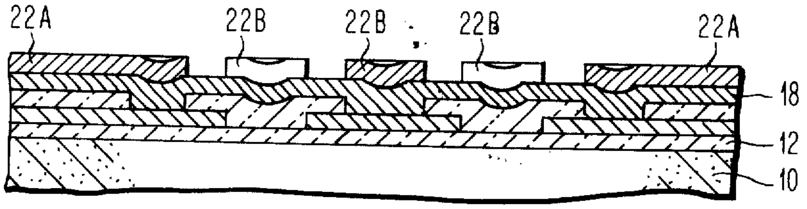
Figure 2F:
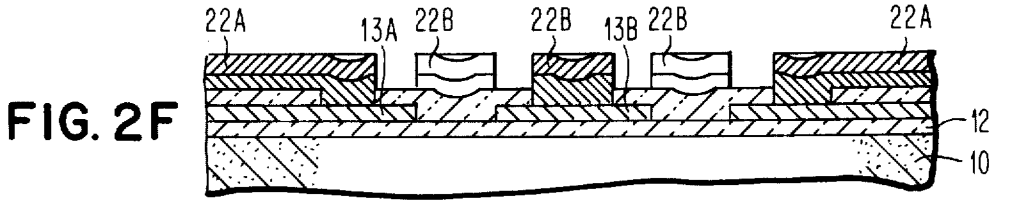
Figure 2G:
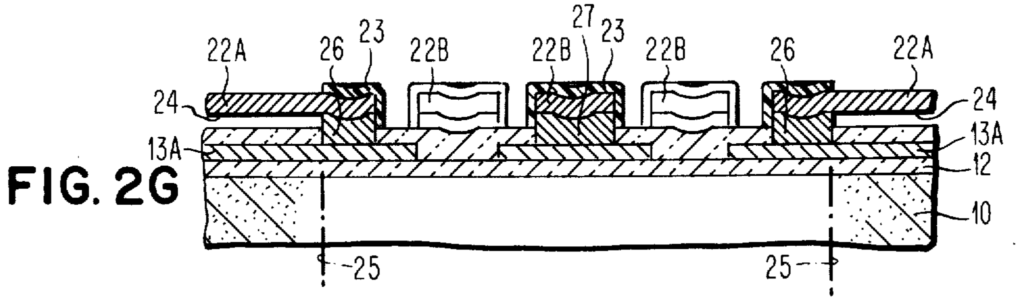
Figure 2H:
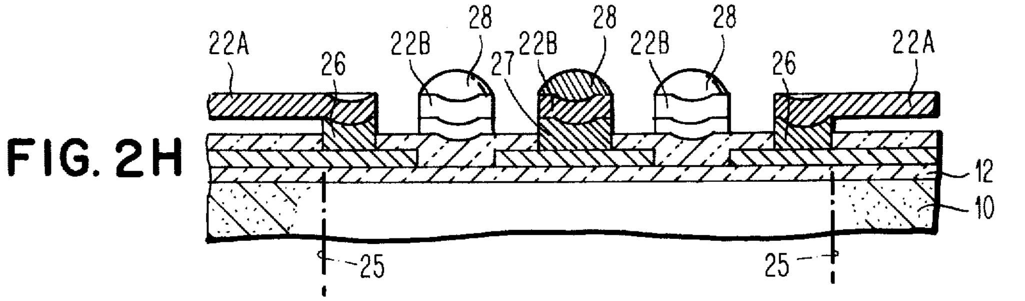
Figure 2I:
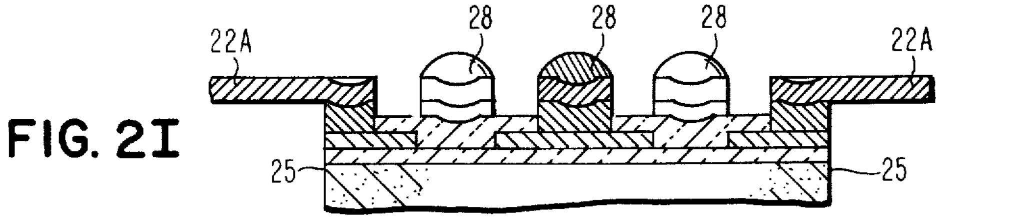
Figure 2J:
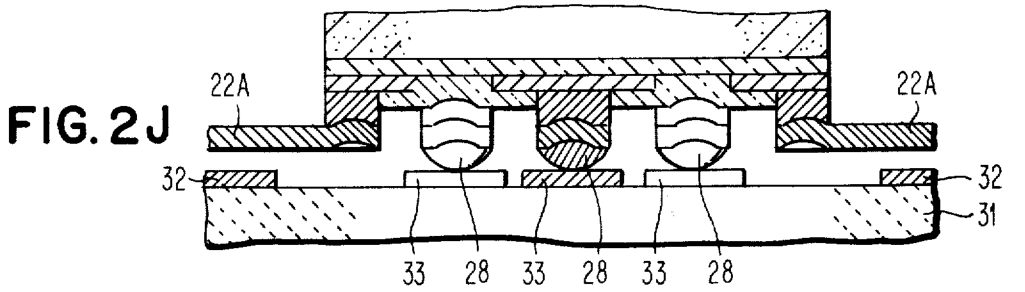
Figure 2K:
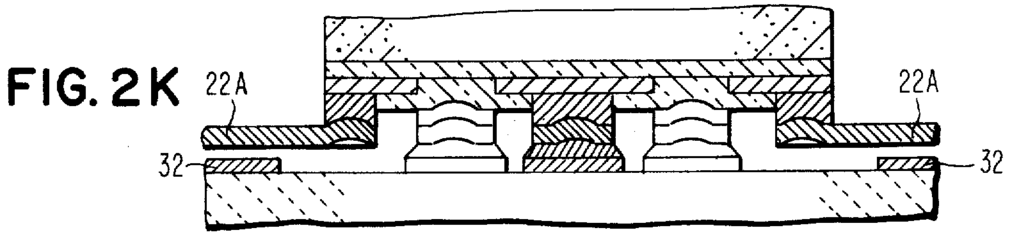

With reference to FIGS. 2–2K, there will now be described the method of fabricating the novel beam-lead integrated circuit chips of the present invention as well as the method of mounting the beam-lead chips on dielectric substrates with self-registration. The initial structure, as shown in the cross-sectional view in FIG. 2, comprises a silicon substrate 10 which may conveniently be a portion of a silicon wafer having a planar surface 11 from which the active and passive devices extend down into substrate 10. These devices which conventionally take the form of regions of different conductivity type are not shown for convenience of illustration. The integrated circuit structure in substrate 10 may be formed by any conventional integrated circuit fabrication technique, such as that described in U.S. Pat. No. 3,539,876. In the following description, the individual steps to be described may each be performed in the conventional manner known in the art as, for example, in U.S. Pat. No. 3,539,876. An insulative layer 12, preferably silicon dioxide, having a thickness in the order of 0.6 micron is formed by the thermal oxidation of silicon substrate 10 or by deposition either by chemical-vapor deposition techniques or by sputter deposition. Layer 12 acts to passivate or protect surface 11 as well as to insulate surface 11 from a metallization interconnection pattern 13 on layer 12. This metallization pattern which is formed by conventional integrated circuit fabrication techniques, as that described in U.S. Pat. No. 3,539,876, e.g., by chemical etching or sputter deposition, provides the interconnections for the integrated circuit devices. The metallization pattern is selectively connected to devices at the surface of substrate 10 by conductive connectors, not shown, selectively passing through insulative layer 12 to the substrate. Metallization pattern 13 has a conventional thickness in the order of 6500A.

With reference to FIG. 2A, the metallization pattern is covered by an overlayer of insulative material 14, such as silicon dioxide, which protects and insulates the metallization pattern. The insulative layer, which has a thickness in the order of one to two times the thickness of interconnector layer 13, is deposited by conventional techniques, preferably RF sputter deposition. Next, utilizing standard silicon dioxide photolithographic etching techniques, as described in U.S. Pat. No. 3,539,876, openings 15, 16 and 17 are etched through silicon dioxide layer 14 to underlying metallization layer 13. A standard etching which may be used is buffered HF. It should be noted that metallization pattern 13 may be any conventional metal used in integrated circuit interconnections but is preferably aluminum or an aluminum-copper alloy. As will be hereinafter described in greater detail, chip contacts to beam-leads are to a solder mound is to be made through opening 17. Consequently, openings 15 and 16 extend to the interconnector metallization proper 13A which is connected with the integrated circuit configuration. On the other hand, opening 17 extends into contact with interconnector land 13B which is discrete and isolated from the interconnector pattern proper, 13A.

Next, FIG. 2B, a chromium-copper layer 18 is deposited over the structure. Preferably, layer 18 is deposited as two successive layers (the subdivision is not shown); first, a layer of chromium in the order of 1000A followed by a layer of copper about 1 micron in thickness. The chromium-copper deposition may be accomplished by any conventional metal techniques such as those described in U.S. Pat. No. 3,539,876.

Then, FIG. 2C, a standard photolithic mask 19 is formed covering chromium-copper composite layer 18 except for openings 20 where the beam-leads are to be formed, and openings 21 where solder mounds are to be formed. Then, utilizing standard gold electroplating techniques, a deposition 22A of gold having a thickness of 1 to 2 microns is made in the beam-lead regions simultaneously with a similar deposition of gold 22B in the regions where the solder mounds are to be formed, FIG. 2D.

The photoresist is removed, FIG. 2E, leaving gold deposits 22A in beam-lead regions and gold deposits 22B in regions where the solder mounds are to be formed.

Then, utilizing suitable etchants which do not attack gold deposits 22A and 22B, layer 18 is removed from all exposed regions, FIG. 2F. Preferably, this is done in two-step process which involves first removing the copper portion of layer 18 with a copper etching solution, such as a conventional ferrichloride or hydrochloric acid solution which does not attack gold, followed by the removal of the chromium portion of layer 18 by a conventional chromium etchant solution, such as potassium permanganate or potassium ferricyanide which also does not attack gold. A suitable etchant for chromium is described in U.S. Pat. No. 3,639,185.

The next step, FIG. 2G, involves freeing the beam-leads 22A from the underlying substrate without affecting the chip contacts or the solder mound contacts. This is accomplished by masking with a conventional photoresist material 23 the chip contacts and the solder mound contacts, and further etching with the previously described etchants for the copper-chromium layer 18 so as to undercut the beam-leads in regions 24 to free the beam-leads from the substrate. The beam-leads will thus be cantilevered over the chip edge 25 which is shown in phantom lines. Beam-leads 22A will be connected to interconnector pattern 13A through chromium-copper contacts 26, while solder mounds contacts 27, which are also chromium-copper, will be preserved covered by gold layer 22B.

Then, FIG. 2H, solder mounds 28 are deposited on gold layer 22B over solder mound contacts 27. These solder mounds are standard compositions and structures previously used in the art for solder reflow contacts as described in U.S. Pat. Nos. 3,495,133; 3,458,925; and 3,392,442. The solder composition has a lower melting point than that of the gold beam-leads 22A. It should be noted that any conventional solder reflow composition and system may be used; in fact, any metallic composition which selectively wets gold regions 22B and has the appropriate lower melting point may be used in place of solder.

Figure 3:
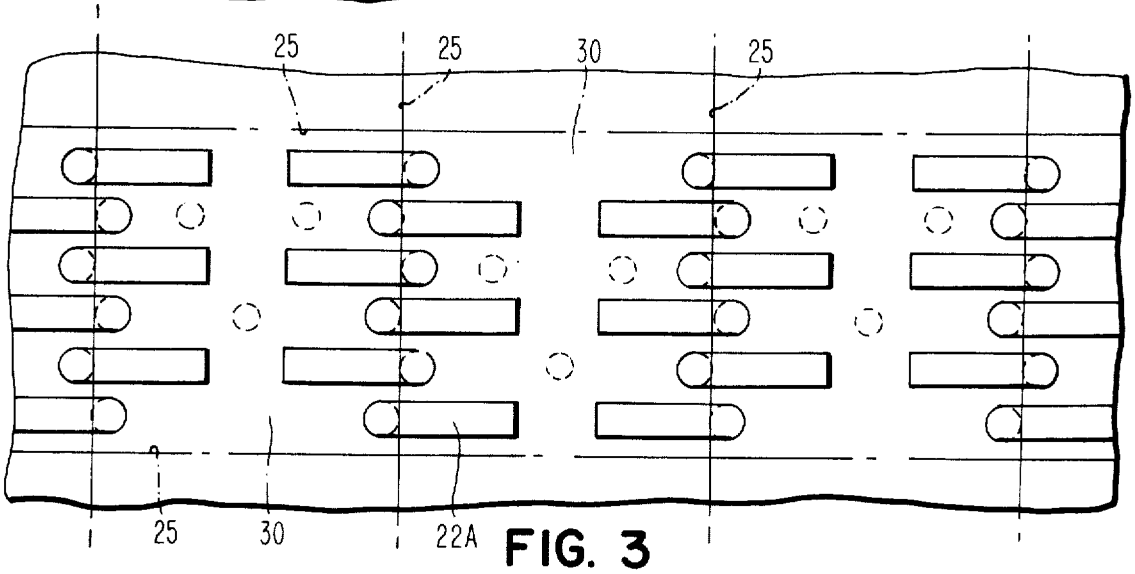
FIG. 3 is a simplified, diagrammatic plan view of a portion of a wafer fabricated in accordance with the present invention just prior to the dicing of the wafer into the individual chips which are defined by the phantom lines.

Next, as shown in FIG. 2I, the chip is diced along edge 25 to provide the cantilevered beam-lead structure. This dicing may be conveniently accomplished by standard laser cutting dicing techniques involving scribing along chip edges 25 on the back side of the wafer by a high energy laser beam, followed by fracturing the wafer into the component chips. U.S. Pat. No. 3,112,850 describes such a conventional technique. In this manner, it is possible to form the novel beam-lead chip of the present invention without great waste of wafer material in the kerf between chips. This advantage of the present invention will be better understood with reference to FIG. 3 wherein a portion of a wafer is shown in adjacent chips 30 having common edges 25 with each other. Beam-leads 22A are staggered in the manner shown so that the beam-leads of a particular chip overlap the adjacent chip. This arrangement has been over-simplified for purposes of illustration and it should be understood that the beam-leads may extend from all four edges of the chips.

Because the beam-leads have been previously freed by the above-described undercutting process, it is not necessary, as in the prior art, to also free the beam-leads during the dicing step. Consequently, dicing can be carried out with a minimum of wafer waste in the kerf between chips. This will be clearly understood to be an improvement over the prior art techniques wherein the entire wafer substrate had to be etched or otherwise removed along the full length of the beam-lead in order to free the beam-lead.

Figure 1:
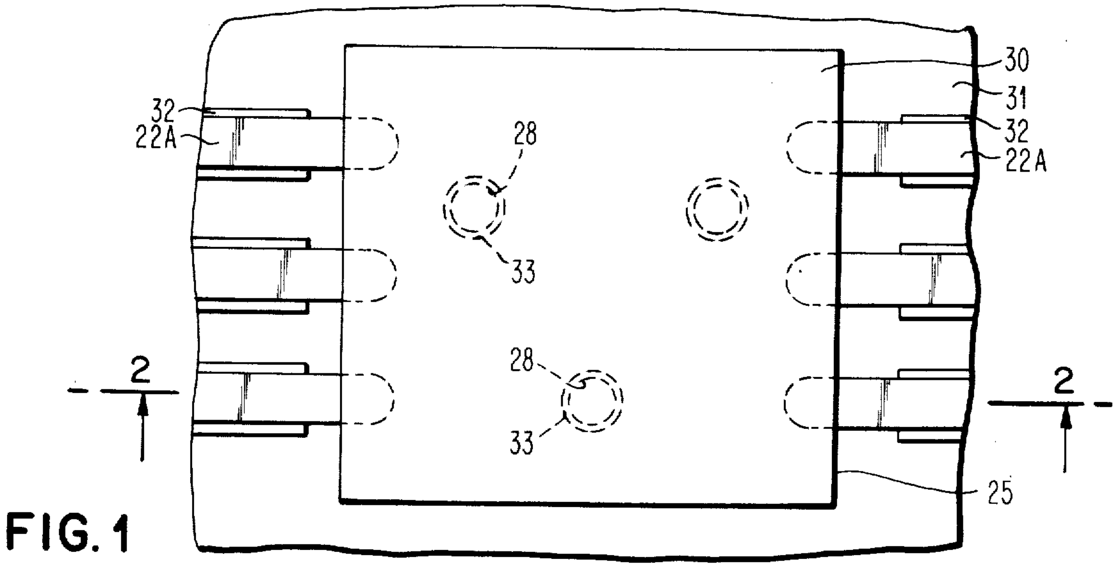
FIG. 1 is a simplified plan view of a portion of a beam-lead assembly illustrating a properly positioned beam-lead chip on a dielectric substrate.

Returning now to the step shown in FIG. 2J, the self-aligning properties of the beam-lead chips of the present invention will now be described. The chips are mounted on a dielectric substrate 31 which may have a structure as described in the previously mentioned U.S. Pat. Nos. 3,495,133 and 3,392,422. FIG. 2J should be considered in combination with FIG. 1 which represents the plan view. Substrate 31, which is conventionally ceramic, has a land pattern thereon, not shown in detail. This land pattern terminates in a plurality of land leads 32 which correspond in disposition to beam-leads 22A on the chip. The plurality of beam-leads 22A should be in registration with the corresponding plurality of land leads 32 in order that these beam-leads may be bonded to the land leads. Ceramic substrate also includes a plurality of land pads 33 disposed so as to correspond to the disposition of solder mounds 28 on the chip. Land leads 32 and pads 33 are conveniently formed simultaneously with substrate 31 and have a standard structure which conveniently may be a silver palladium or gold palladium conductive layer on which has been deposited a very thin layer of lead. In the illustration, this composite is shown as a single layer. In the preferred structure of the present invention, pads 33 are unconnected to the land leads of the conductive land pattern on the substrate and thus are electrically isolated. Likewise, as previously mentioned, the solder mounds are also electrically insulated from the interconnector pattern and thus from the integrated circuit on the beam-lead chip.

Figure 1A:
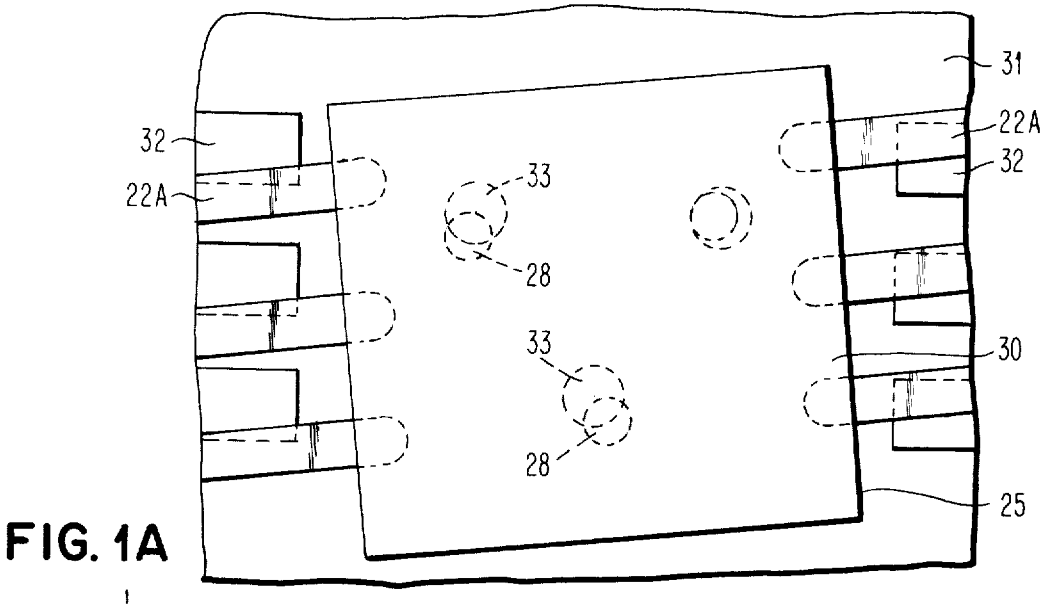
FIG. 1A is the same view as FIG. 1 except that it illustrates a chip initially placed on the substrate land pattern.

In depositing the chip on the substrate during the mounting process, it is not necessary to have any sort of a precise alignment between the beam-leads 22A and the land leads 32. All that is necessary is to deposit the chip so that solder mounds 28 make a very gross contact with land pads 33. For illustration, such a gross contact is shown in FIG. 1A.

After this gross mounting step, the structure is heated to a temperature sufficient to melt solder mounds 28 but insufficient to affect beam-leads 22A. Appropriate melting temperature and conditons are described in detail in the aforementioned U.S. Pat. Nos. 3,392,422 and 3,495,133. Because of the selective wettability of solder mounds 28 for land pads 33, the melted solder mounds will self-center themselves within land pads 33, and the chip will rotate in the direction shown by the arrows in FIG. 1A to bring beam-leads 22A into precise alignment with land leads 33, as shown in FIG. 1. Then, the structure is permitted to cool, and the centered solder mounds 28 will solidify, as shown in FIG. 2K, fixing the beam-lead chip and thereby its beam-leads 22A into precise alignment with land leads 32.

The structure is then subjected to a standard thermo-compression bonding step, utilizing standard bonding apparatus such as that described in U.S. Pat. Nos. 3,475,814 and 3,672,034 to fix and connect the beam-leads to the land leads.

In the embodiment shown, the number of beam-leads per chip has been markedly reduced for purposes of illustration. Also, the size of these beam-leads relative to the size of the solder mounds has been enlarged. In other words, in an actual beam-lead structure having the high densities of devices and terminals as required in large scale integration, there could be in the order of fifty or more beam-leads per chip and these beam-leads could be disposed about all four edges of the chip. Accordingly, in such structures, the beam-leads could be miniaturized to the point that it would be impossible to manually align such beam-leads with respect to land leads using conventional microscope-aided manual techniques. However, because of the proportionally greater size of the solder mounds, it would still be possible to properly align the solder mounds with respect to the land pads manually. Thus, in the self-alignment step described, the solder mounds when self-centering within the land pads could move through distances several times the width of a beam-lead. In such situations, the present invention could be used to self-align chips deposited in a gross orientation wherein the respective beam-leads were several widths out of alignment.

While the present description has stressed the advantages of the novel beam-lead structure of the present invention with respect to the self-alignment of the chip on the dielectric substrate, the description has also mentioned other advantages of the beam-lead structure. These advantages permit the beam-lead structure to be utilized, even without the self-aligning solder mound feature, to greater advantage, particularly in large scale integrated circuit chips. In addition to those advantages already set forth, the present novel beam-lead chip has another advantage even when it is "back side" mounted on the dielectric substrate, i.e., mounted so that the side of the chip opposite to the planar device surface contacts the chip. In such a case, the beam-leads will extend from the upper or unmounted surface and will have to be flexed downward along the edge of the chip into contact with the substrate. Such a flexing would be expected to induce considerable stresses in the insulative layer at the point where the beam-lead meets the periphery of the chip. In the present structure, because the beam-leads are on a level above that of the interconnector metallization, the insulation between the beam-lead and the semiconductor surface is much greater than in conventional beam-leads which are on the same level as the interconnector metallurgy. Consequently, in the present structure, any damage to the insulative material-under the beam-lead due to the stress would be less likely to short the beam-lead to the substrate because of this increased thickness of insulative material.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A beam-lead integrated circuit chip structure comprising:

a semiconductor chip substrate having a surface from which the active and passive devices in the circuit extend into the substrate, a first layer of electrically insulative material over said surface, a metallic interconnector pattern formed on said layer in a first plane, said pattern being selectively connected to said devices by device contacts extending through said layer, a second layer of electrically insulative material over said interconnector pattern, a plurality of chip contacts extending through said second layer into contact with said interconnector pattern, a plurality of solder mounds having a lower melting point than beam-leads extending from the surface of said chip structure to a level beyond said second plane, and a plurality of peripheral cantilevered metallic beam-leads, disposed in a second plane, respectively in contact with said chip contacts and extending beyond the periphery of said chip.

2. The beam-lead chip structure of claim 1 wherein said pluarlity of solder mounds are electrically insulated from said devices and said interconnector pattern.

3. The beam-lead chip structure of claim 1 wherein each of said solder mounds is respectively supported on a support structure comprising a metallic land formed on said first insulative layer, a mound contact spaced from but of the same composition as said chip contact extending through said second insulative layer to said metallic land, and a metallic layer of the same metal and in the same plane as said beam-leads on said mound contact and supporting said solder mound.

4. The beam-lead chip structure of claim 1 wherein said beam-leads are spaced from said second layer.

5. A beam-lead integrated circuit chip assembly comprising a dielectric substrate, a beam-lead integrated circuit chip structure mounted on said substrate, which chip structure comprises a semiconductor chip substrate having a surface from which the active and passive devices in the circuit extend into the substrate, a first layer of electrically insulative material over said surface, a metallic interconnector pattern formed on said layer in a first plane, said pattern being selectively connected to said devices by device contacts extending through said layer, a second layer of electrically insulative material over said interconnector pattern, a plurality of chip contacts extending through said second layer into contact with said interconnector pattern, a plurality of peripheral cantilevered metallic beam-leads, disposed in a second plane, respectively in contact with said chip contacts and extending beyond the periphery of said chip and a plurality of solder mounds having a lower melting point than said beam-leads extending from the surface of said chip structure, said dielectric substrate comprising a metallic land pattern formed on a surface of said substrate, a plurality of land leads extending from said conductive land pattern on said dielectric substrate in registration with a plurality of said beam-leads which are respectively mounted on said land leads, and a plurality of land pads on said dielectric substrate respectively supporting said plurality of solder mounds.

6. The assembly structure of claim 5 wherein said plurality of solder mounds are electrically insulated from the devices in said interconnector pattern.

7. The assembly structure of claim 6 wherein said plurality of land pads are electrically isolated from said land pattern.

8. The assembly structure of claim 5 wherein said beam-leads are spaced from said second insulative layer.

9. The assembly structure of claim 6 wherein each of the solder mounds in said chip is respectively supported on a support structure comprising a metallic land formed on said first insulative layer, a mound contact spaced from but of the same composition as said chip contact extending through said second insulative layer, and a metallic layer of the same metal and in the same plane as said beam-leads on said mound contact and supporting said solder mound.

10. The beam-lead chip structure of claim 1 wherein said plurality of solder mounds comprises at least three solder mounds.

11. The beam-lead integrated circuit assembly of claim 5 wherein said plurality of solder mounds comprises at least three solder mounds.

12. A beam-lead integrated circuit chip structure comprising a semiconductor chip substrate having a passivated planar surface from which the active and passive devices in the circuit extend into the substrate, a plurality of peripheral beam-leads interconnected with the circuit devices extending beyond the periphery of the chip, and a plurality of solder mounds having a lower melting point than said beam-leads extending from said surface to a plane further from said surface than the plane of said beam-leads.

13. The beam-lead integrated circuit structure of claim 12 wherein said solder mounds are electrically insulated from said chip substrate and beam-leads.

14. The beam-lead integrated circuit chip structure of claim 12 wherein said plurality of solder mounds comprises at least three solder mounds.

15. A beam-lead integrated circuit chip assembly comprising a dielectric substrate, a beam-lead integrated circuit chip structure mounted on said substrate, which chip structure comprises a semiconductor chip substrate having a passivated planar surface from which the active and passive devices in the circuit extend into the substrate, a plurality of peripheral beam-leads interconnected with the circuit devices extending beyond the periphery of the chip, and a plurality of solder mounds having a lower melting point than said beam-leads extending from said surface to a plane further from said surface than the plane of said beam-leads, said dielectric substrate comprising a metallic land pattern formed on a surface of said substrate, a plurality of land leads extending from said conductive land pattern on said substrate in registration with a plurality of said beam-leads which are respectively mounted on said land leads, and a plurality of land pads on said dielectric substrate respectively supporting said plurality of solder mounds.

16. The assembly structure of claim 15 wherein said plurality of solder mounds are electrically insulated from said devices and beam-leads, and said plurality of land pads are electrically isolated from said land pattern.

* * * * *